(12) United States Patent
Li et al.

(10) Patent No.: US 7,742,301 B2
(45) Date of Patent: Jun. 22, 2010

(54) HEAT DISSIPATING ASSEMBLY

(75) Inventors: Min Li, Shenzhen (CN); Lei Cao, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 259 days.

(21) Appl. No.: 11/959,298

(22) Filed: Dec. 18, 2007

(65) Prior Publication Data

US 2009/0154100 A1   Jun. 18, 2009

(51) Int. Cl.
H05K 7/20 (2006.01)

(52) U.S. Cl. .................. 361/697; 361/695; 361/679.48; 361/679.54

(58) Field of Classification Search ................. 361/697, 361/695, 679.48, 679.54
See application file for complete search history.

(56) References Cited

U.S. PATENT DOCUMENTS

| | | | | | |
|---|---|---|---|---|---|
| 5,368,094 | A | * | 11/1994 | Hung | 165/80.3 |
| 5,502,619 | A | * | 3/1996 | Wang | 361/697 |
| 5,615,998 | A | * | 4/1997 | Kodama et al. | 415/177 |
| 5,835,347 | A | * | 11/1998 | Chu | 361/697 |
| 5,854,738 | A | * | 12/1998 | Bowler | 361/695 |
| 5,973,921 | A | * | 10/1999 | Lin | 361/695 |
| 6,104,609 | A | * | 8/2000 | Chen | 361/695 |
| 6,269,001 | B1 | * | 7/2001 | Matteson et al. | 361/695 |
| 6,525,941 | B1 | * | 2/2003 | Lai | 361/697 |
| 6,672,374 | B1 | * | 1/2004 | Lin | 165/121 |
| 7,133,288 | B2 | * | 11/2006 | DelPrete et al. | 361/719 |
| 7,221,568 | B2 | * | 5/2007 | Hung et al. | 361/697 |
| 7,230,828 | B2 | * | 6/2007 | Lee et al. | 361/704 |
| 7,580,259 | B2 | * | 8/2009 | Hsiao | 361/695 |
| 2002/0179285 | A1 | * | 12/2002 | Sas et al. | 165/80.3 |
| 2007/0119567 | A1 | * | 5/2007 | Yeh et al. | 165/80.3 |
| 2008/0024986 | A1 | * | 1/2008 | Chen et al. | 361/697 |
| 2008/0049397 | A1 | * | 2/2008 | Long et al. | 361/697 |
| 2008/0062653 | A1 | * | 3/2008 | Li | 361/719 |
| 2008/0156458 | A1 | * | 7/2008 | Li et al. | 165/80.3 |
| 2009/0044927 | A1 | * | 2/2009 | Hwang et al. | 165/80.3 |
| 2009/0059524 | A1 | * | 3/2009 | Peng et al. | 361/697 |
| 2009/0129019 | A1 | * | 5/2009 | Li et al. | 361/697 |

* cited by examiner

*Primary Examiner*—Anatoly Vortman
(74) *Attorney, Agent, or Firm*—Jeffrey T. Knapp

(57) ABSTRACT

A heat dissipating assembly for dissipating heat from a plurality of electronic components, including a heat sink (10) mounted on an electronic component, a fan (40), a first holder (50), and a second holder (60). The fan has a part secured on the heat sink by the first holder that is fixed at a lateral side of the heat sink, and another part located beyond a periphery of the heat sink being secured to the heat sink by the second holder that is fixed at an opposite side of the heat sink. An airflow produced by the fan has a part blowing the heat sink to remove heat from the one of the electronic component, and another part blowing another electronic component, which is located below the another part of the fan, thus dispersing heat from the another electronic component.

20 Claims, 5 Drawing Sheets

HEAT DISSIPATING ASSEMBLY

BACKGROUND OF THE INVENTION

1. Field of the Invention

The present invention relates to a heat dissipating assembly, and more particularly to a heat dissipating assembly incorporating a pair of holders that can hold a fan to cool a plurality of electronic components simultaneously.

2. Description of Related Art

The central processing unit (CPU) mounted on the motherboard in a computer is the center of operations of the computer. During the operation of the computer, the CPU produces heat. The heat must be quickly carried away from the CPU during the operation of the computer, since excessively high temperature would cause the CPU to work abnormally.

Typically, a related heat sink is mounted on the CPU to absorb heat therefrom. A fan is often mounted on the heat sink to provide a forced airflow to blow the heat sink, for enhancing a heat dissipating efficiency of the heat sink. The fan is located just on the heat sink with its airflow outlet oriented towards the heat sink, whereby when the fan operates, the airflow produced by the fan blows the heat sink downwardly and forcedly, and removes the heat in the heat sink from the CPU.

However, the fan mounted on the heat sink can only dissipate heat generated by the CPU, and not blow to other electronic components distributed near the CPU; thus, the electronic components that do not obtain the forced airflow may not dissipate heat generated therefrom rapidly just with heat sinks mounted thereon, they would operate unstably or even fail.

What is needed, therefore, is a heat dissipating assembly which can overcome the above-mentioned disadvantage.

SUMMARY OF THE INVENTION

A heat dissipating assembly for dissipating heat from a plurality of electronic components, including a heat sink mounted on an electronic component, a fan, a first holder, and a second holder. The fan has a part secured on the heat sink by the first holder that is fixed at a lateral side of the heat sink, and another part beyond a periphery of the heat sink being secured to the heat sink by the second holder that is fixed at an opposite side of the heat sink. An airflow produced by the fan has a part blowing the heat sink to remove heat from the one of the electronic component, and another part blowing another electronic component, which is located below the another part of the fan, thus dispersing heat from the another electronic component.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
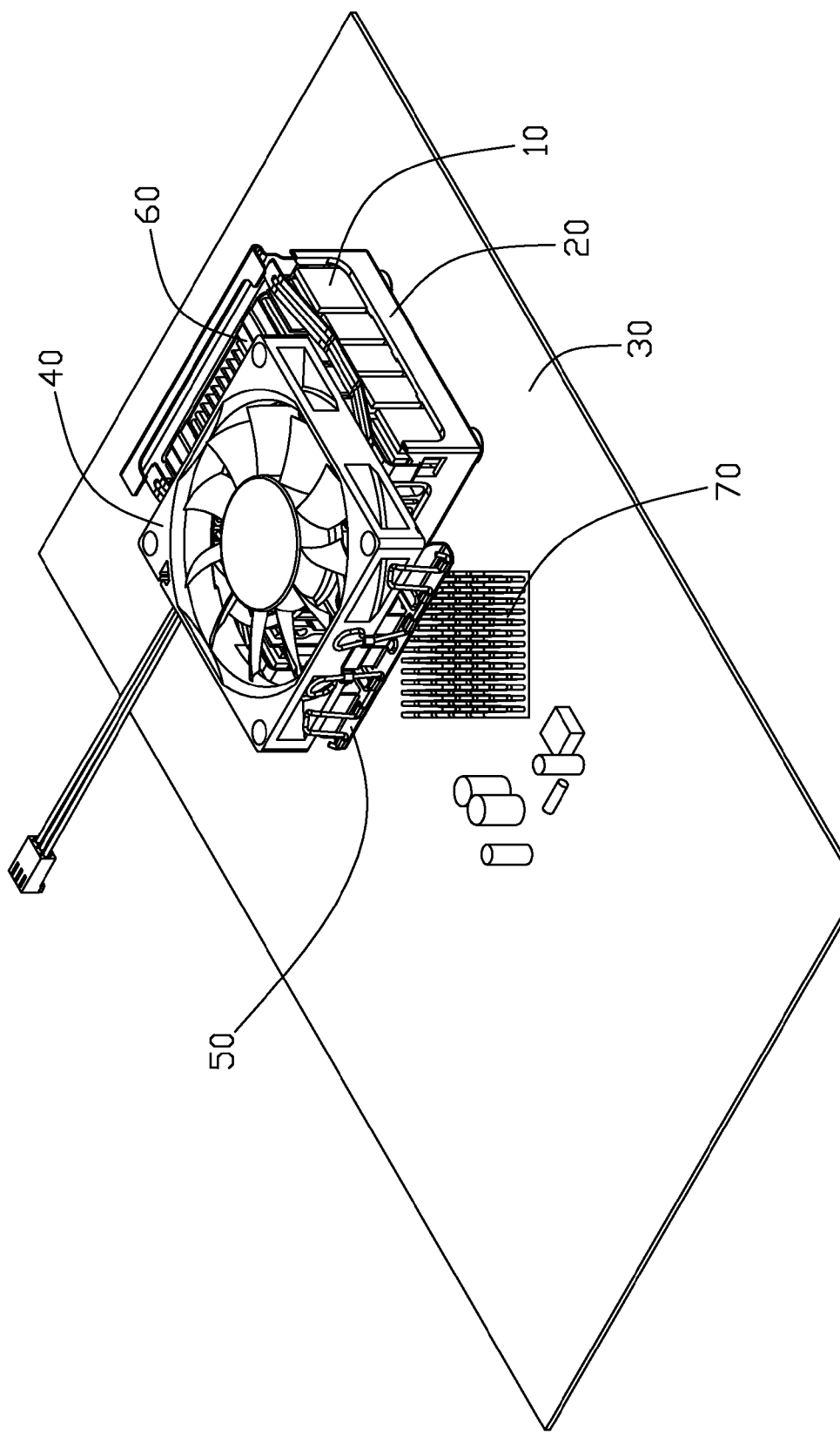
FIG. 1 is an assembled, isometric view of a heat dissipating assembly in accordance with a preferred embodiment of the present invention mounted on a printed circuit board with another heat sink disposed thereon.

Referring to FIG. 1, a heat dissipating assembly in accordance with a preferred embodiment of the present invention comprises a heat sink 10 contacting an electronic component (not shown), a retention module 20 securing the heat sink 10 on a printed circuit board 30, a fan 40 disposed on the heat sink 10, a first holder 50 fixing a lateral portion of the fan 40 to a lateral side of the heat sink 10, and a second holder 60 fixing an opposite lateral portion of the fan 40 on the heat sink 10. The electronic component is mounted on a side of the printed circuit board 30 that has another electronic component (not shown) mounted adjacent to the electronic component. Another heat sink 70 is attached on the another electronic component for dissipating heat therefrom.

Figure 2:
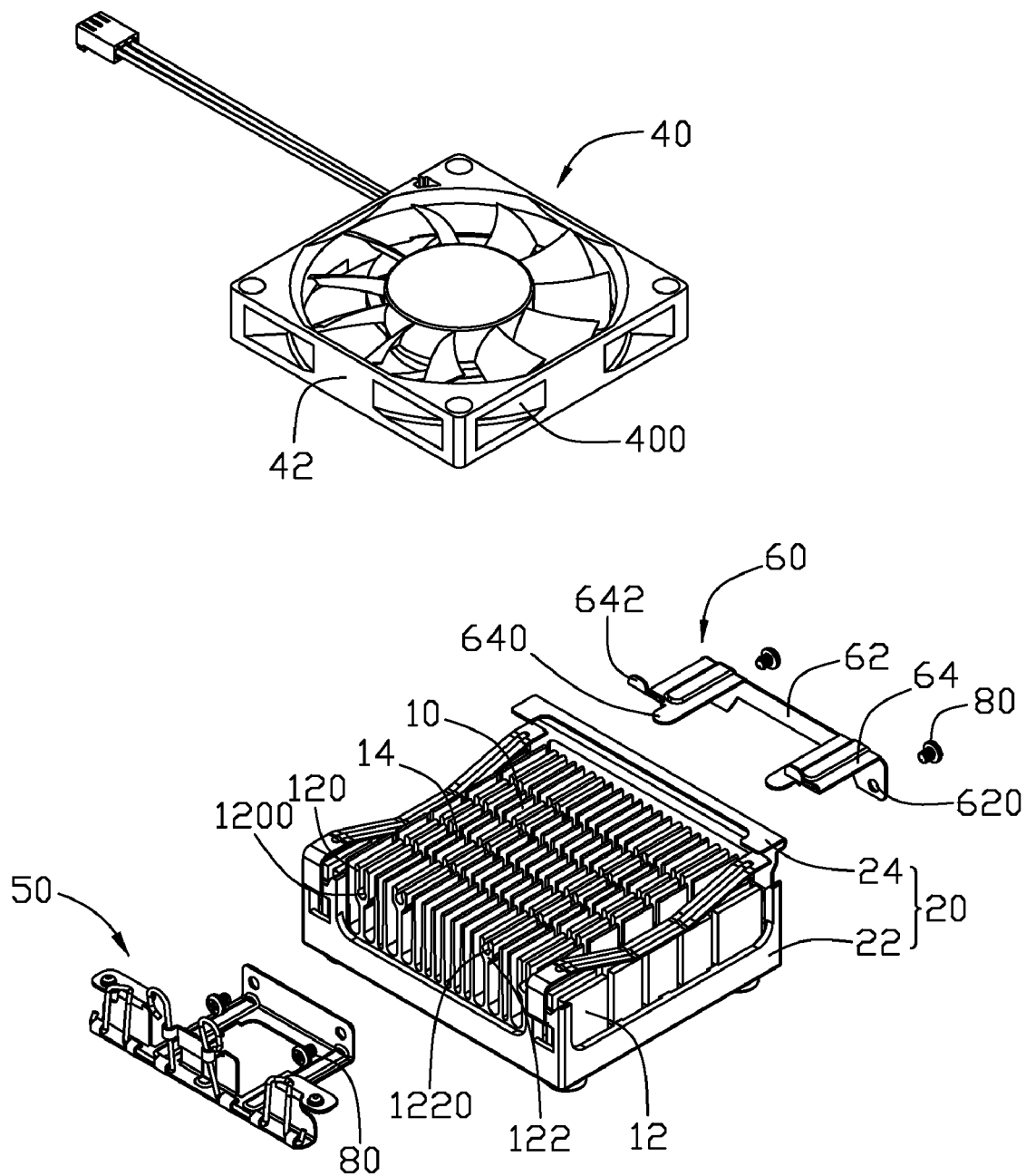
FIG. 2 is an exploded view of the heat dissipating assembly of FIG. 1.

As shown in FIG. 2, the heat sink 10 comprises a base (not shown) having a bottom face contacting the electronic component, and a plurality of fins 12 extending upwardly and vertically from a top face of the base. A pair of first fins 120 that are symmetrical with each other, are located near a front side and a rear side of the heat sink 10 respectively, wherein each of the pair of first fins 120 has an upper portion bifurcated upwardly to form a fork configuration. A threaded hole 1200 is defined horizontally through a central portion of the each of the pair of first fins 120, thereby to provide a passage for a screw 80. A pair of second fins 122 are located between the pair of first fins 120 with each of the pair of second fins 122 having a configuration similar to the each of the pair of first fins 120. A plurality of slots 14 is defined across each of the plurality of fins 12 so as to divide the plurality of fins 12 into smaller fins, for providing more passages for an airflow. The retention module 20 comprises a square frame 22 fixed on the printed circuit board 30 and enclosing the base of the heat sink 10, and a fastener 24 attached to the square frame 22 for pressing downwardly against some of the plurality of fins 12 located at the front side and rear side of the heat sink 10, thus securing the heat sink 10 on the electronic component.

Figure 3:
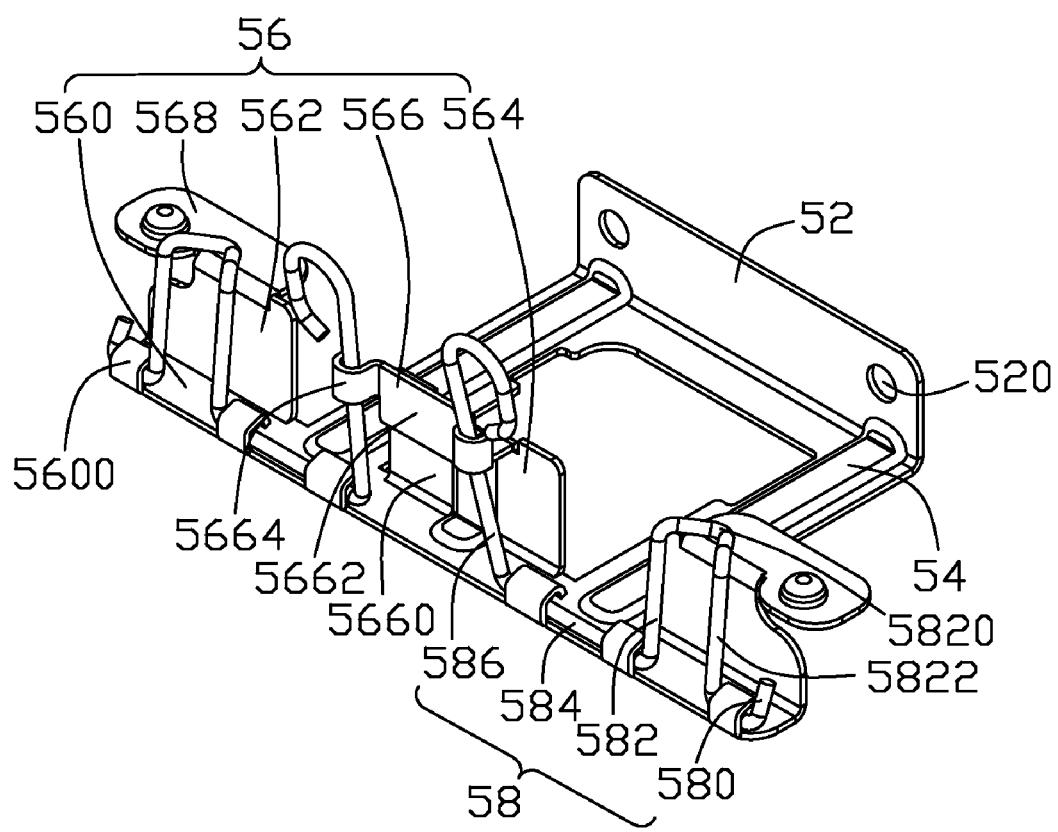
FIG. 3 is an enlarged view of a first holder of FIG. 1
Figure 4:
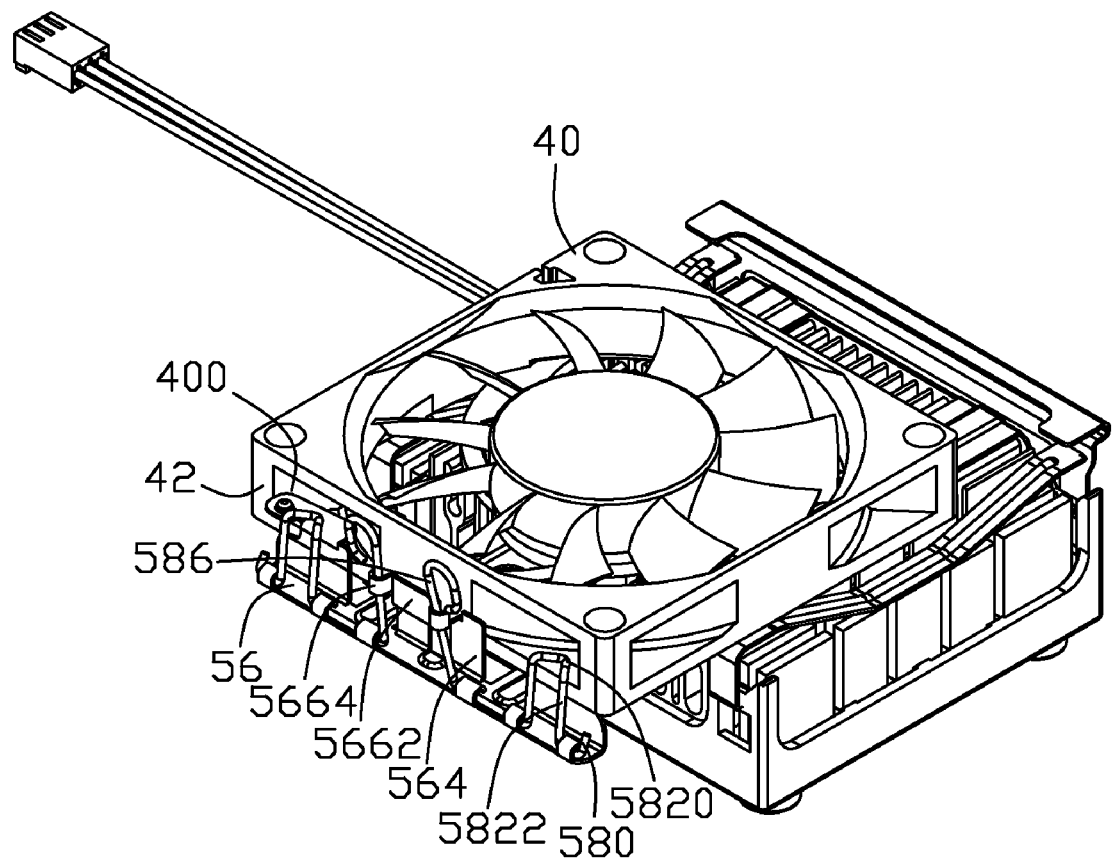
FIG. 4 is an assembled view of FIG. 2.

As illustrated in FIGS. 2-3, the first holder 50 is located at a left side of the heat sink 10, and comprises a rectangular panel 52, a pair of parallel beams 54 extending horizontally and perpendicularly from a bottom side of the panel 52, a flange 56 connecting ends of the pair of beams 54, and a pair of wire clips 58 pivotably engaging with the flange 56. A pair of holes 520 are defined in the panel 52 corresponding to a pair of threaded holes 1220 of the pair of second fins 122 (shown in FIG. 2) respectively, for allowing the screws 80 to extend therethrough, and be threadedly engaged in the threaded holes 1220, thus attaching the first holder 50 to the heat sink 10. The pair of beams 54 are respectively located at two opposite ends of the panel 52 and each has a predetermined width for providing suitable resilience for the first holder 50. The flange 56 comprises a bottom member 560 connecting the ends of the pair of beams 54, four baffle plates 562, 564, 566 extending upwardly from an inner side of the bottom member 560, and a pair of top members 568 bent inwardly and horizontally from two baffle plates 562, respectively. A length of the bottom member 560 of the flange 56 is larger than that of the panel 52, so that the pair of beams 54 divide the bottom member 560 of the flange 56 into three regions, wherein the two baffle plates 562 stand on two regions that are respectively located at a front side and a rear side of the flange 56, and another two baffle plates 564, 566 stand on a central region. A plurality of curved latches 5600 are formed inwardly from an outer side of the bottom member 560 of the flange 56 in such a manner that every two adjacent ones of the plurality of latches 5600 are located at each of the three regions. Each of the plurality of latches 5600 has an end spaced a distance from a top face of the bottom member 560 of the flange 56, thereby defining a gap therebetween for allowing the pair of wire clips 58 to pass through. The plurality of latches 5600 is in alignment with each other, thus cooperatively defining a straight passage for receiving corresponding parts of the pair of wire clips 58 therein. The four baffle plates 562, 564, 566 are separated from each other. The baffle plate 566 is bent to have a lower portion 5660 coplanar with the baffle plate 564, an upper portion 5662 bent outwardly to be parallel to the baffle plate 564, and a horizontal connecting portion (not labeled) interconnecting the lower portion 5660 and the upper portion 5662 thereof. The upper portion 5662 of the baffle plate 566 is staggered with the baffle plate 564 for sandwiching a left sidewall 42 of the fan 40 therebetween. A pair of arced latches 5664 are formed at two opposite sides of the upper portion 5662 of the baffle plate 566, and extend toward two opposite, horizontal orientations, which are perpendicular to a vertical orientation that the plurality of curved latches 5600 extend towards. The two baffle plates 562 are located symmetrically at two flanks of the pair of beams 54 with each other. The pair of top members 568 are perpendicular to the two baffle plates 562 and coplanar with each other for supporting the fan 40 thereon.

The pair of wire clips 58 are pivoted at the first holder 50 with each of the pair of wire clips 58 spanning across nearly a half of the bottom member 560 of the flange 56. Each of the pair of wire clips 58 is bent by a resilient metal wire, and sequentially comprises an upwardly upright distal section 580, a horizontal first pivoting section (not labeled), an upward pressing section 582, a second horizontal pivoting section 584, and an upward operating section 586, along a lengthwise direction of the bottom member 560 of the flange 56. The pressing section 582 comprises a triangle bended portion 5820 located above the pair of top members 568 of the flange 56, and two parallel and straight connecting portions 5822 connecting the bended portion 5820 with the first pivoting section and the second pivoting section 584, respectively. The bended portion 5820 is oriented inwardly and downwardly towards the heat sink 10, whereby the bended portion 5820 and the two connecting portions 5822 define an acute angle therebetween. In assembly of the first holder 50, the first pivoting section of the each of the pair of wire clips 58 is brought to be received in one of the plurality of curved latches 5600 that is located at an end of the bottom member 560 of the flange 56; the second pivoting section 584 is locked into two of the plurality of curved latches 5600 that are located adjacent to the one of the plurality of curved latches 5600, thus pivotably attaching the pair of wire clips 58 to the flange 56. The operating sections 586 of the pair of wire clips 58 are pivoted to an outwardly, horizontal orientation, and the pressing sections 582 are driven by the operating sections 586 to rotate to the outwardly horizontal orientation, for readily facilitating an assembling of the heat dissipating assembly.

Figure 5:
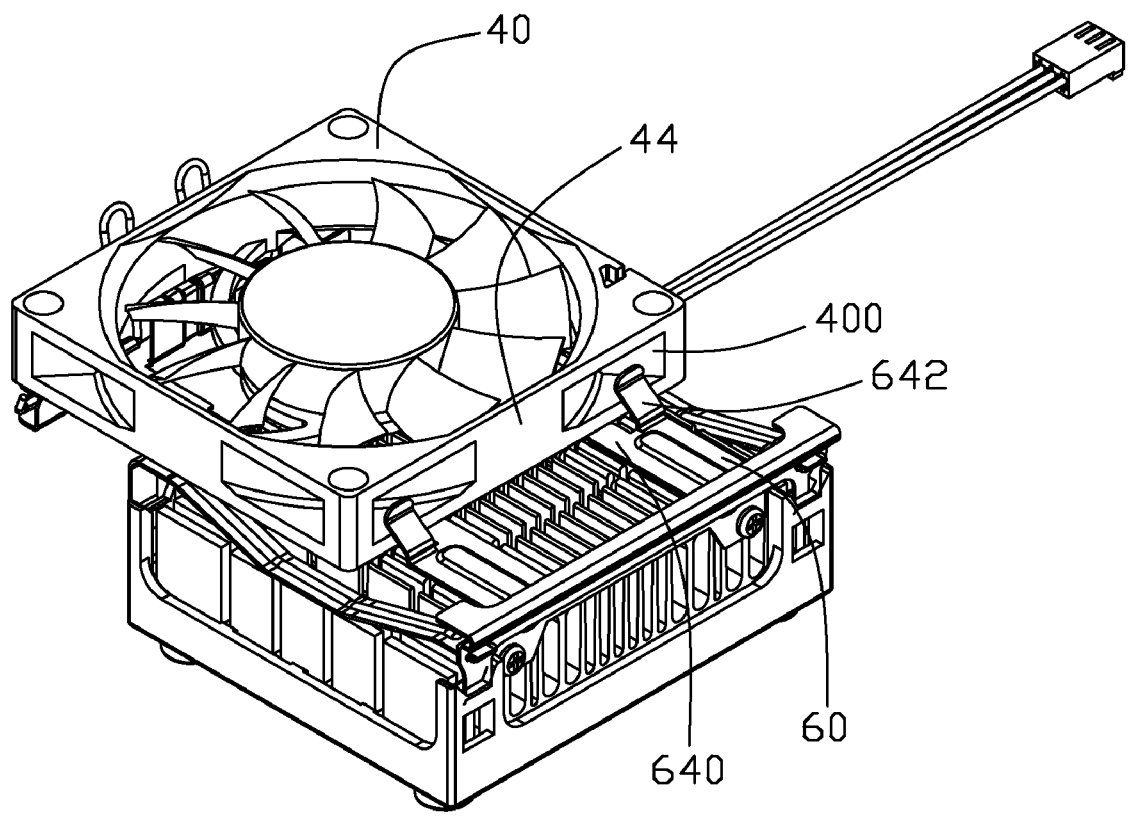
FIG. 5 is another view of FIG. 3.

Referring to FIGS. 2 and 5, the second holder 60 is secured on a right side of the heat sink 10. The second holder 60 comprises a vertical plate 62, a pair of strips 64 extending inwardly and horizontally from a top side of the plate 62. A pair of holes 620 are defined at two ends of the plate 62 corresponding to the threaded holes 1200 in the pair of first fins 120, for allowing the screws 80 to extend therethrough and be threadedly engaged in the threaded holes 1200 in the pair of first fins 120; therefore, the second holder 60 is fixed on the heat sink 10 firmly. An end of each of the pair of strips 64 is divided into two parts along a midline of a width thereof, wherein a half of the end is bent upwardly and slantwise to form an upper tab 642, and another half of the end remains its original configuration to form a lower tab 640. An end of the upper tab 642 is further bent upwardly to be parallel to the upper portion 5662 of the baffle plate 566 of the flange 56 of the first holder 50.

The fan 40 has a substantially square configuration with a plurality of apertures 400 defined in lateral sidewalls 42, 44 thereof. A width of the fan 40 is similar to a distance from the end of the upper tab 642 of the second holder 64 to the upper portion 5662 of the baffle plate 566 of the first holder 50.

As shown in FIGS. 2-5, in assembly, the fan 40 is disposed on the pair of top members 568 of the first holder 50 and tops of the plurality of fins 12 of heat sink 10, and sandwiched between the end of the upper tab 642 of the second holder 60 and the upper portion 5662 of the baffle plate 566 of the first holder 50. A central portion of the left sidewall 42 of the fan 40 is sandwiched between the upper portion 5662 of the baffle plate 566 and the baffle plate 564 of the flange 56 of the first holder 50. Then the operating section 586 of the each of the pair of wire clips 58 is brought to be pivoted towards the heat sink 10 from the outwardly, horizontal orientation, to drive the pressing section 582 to rotate inwardly toward the heat sink 10. When the operating section 586 is pivoted to an almost vertical orientation, it abuts against a corresponding one of the pair of arced latches 5664. At the same time, the pressing section 582 is driven by the operating section 586 to rotate around the first pivoting section and the second pivoting section 584, and push the fan 40 to slide inwardly in respect to the heat sink 10 with the pair of connecting portions 5822 thereof pressing a bottom portion of the left sidewall 42 of the fan 40 inwardly. As the inward movement of the fan 40, the upper tab 642 of the second holder 60 is interferingly raised by a bottom portion of a right sidewall 44 of the fan 40 and inserted into a corresponding one of the plurality of apertures 400, wherein the bottom portion of the right sidewall 44 of the fan 40 is sandwiched between the upper tab 642 and the lower tab 640 of the second holder 60. Until the operating section 586 is locked into the corresponding one of the pair of arced latches 5664, the bended portion 5820 of the pressing section 582 is oriented inwardly and downwardly, and abuts against the bottom portion of the left sidewall 42 of the fan 40; the upper tab 642 of the second holder 60 presses downwardly against the bottom portion of the right sidewall 44 of the fan 40. The first holder 50 and the second holder 60 provide downward pressures acting on the two opposite lateral sides of the fan 40 respectively, thus preventing the fan 40 from sliding in respect to the heat sink 10, and enabling the fan 40 secured on the heat sink 10 firmly.

In use, the fan 40 operates to produce the airflow toward the printed circuit board 30. Since the fan 40 has a part located over the heat sink 10 and another part located above the another heat sink 70, a part of the airflow blows the plurality of fins 12 of the heat sink 10 to remove the heat on the heat sink 10 from the electronic component; another part of the airflow passes through the first holder 50 to blow the another heat sink 70, thus dissipating heat on the another heat sink 70 from the another electronic component. Therefore, the heat dissipating assembly can simultaneously cool a plurality of electronic components with the forced airflow, and stable operations of the electronic components are thus ensured, accordingly.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipating assembly adapted for dissipating heat generated by a plurality of electronic components, the heat dissipating assembly comprising:
a heat sink mounted on one of the plurality of electronic components;
a fan having a part disposed on the heat sink, and another part located beyond a periphery of the heat sink, the another part of the fan adapted for being located above another one of the plurality of electronic components;
a first holder fixed on a lateral side of the heat sink and securing the another part of the fan to the heat sink; and
a second holder fixed on an opposite lateral side of the heat sink and securing the part of the fan on the heat sink, wherein when the fan is in operation, an airflow exerted by the fan has a part blowing the heat sink to remove heat from the one of the plurality of electronic components, and another part passing through the first holder for blowing the another one of the plurality of electronic components.

2. The heat dissipating assembly as claimed in claim 1, wherein the first holder comprises a panel fixed at the lateral side of the heat sink, a pair of beams extending outwardly from the panel, a flange connecting the pair of beams, and a pair of wire clips pivotably attached on the flange for securing the another part of the fan thereon.

3. The heat dissipating assembly as claimed in claim 2, wherein the flange of the first holder comprises a bottom member connecting ends of the pair of beams, a plurality of baffle plates extending upwardly from an inner side of the bottom member, and a pair of top members formed inwardly from two of the plurality of the baffle plates, the pair of top members contacting the another part of the fan for supporting the fan thereon.

4. The heat dissipating assembly as claimed in claim 3, wherein the pair of beams divide the bottom member of the flange into three regions, the two of the plurality of the baffle plates being located at two separated ones of the three regions respectively, and remaining ones of the plurality of the baffle plates being located at a central one of the three regions.

5. The heat dissipating assembly as claimed in claim 4, wherein the remaining ones of the plurality of the baffle plates comprise a first tab perpendicular to the bottom member of the flange, and a second tab spaced from the first tab, a lateral side of the fan being sandwiched between the first tab and the second tab.

6. The heat dissipating assembly as claimed in claim 5, wherein the second tab of the first holder has a lower portion being coplanar with the first tab, and an upper portion bent outwardly to be staggered with the first tab, the lateral side of the fan being sandwiched between the upper portion of the second tab and the first tab.

7. The heat dissipating assembly as claimed in claim 5, wherein a plurality of curved latches is formed inwardly from an outer side of the bottom member of the flange, and a pair of arced latches extend oppositely from two opposite sides of the second tab of the flange, the pair of wire clips being locked into the plurality of curved latches and the pair of arced latches.

8. The heat dissipating assembly as claimed in claim 7, wherein the plurality of curved latches are in line with each other, every two adjacent ones of the plurality of curved latches being located in each of the three regions on the bottom member of the flange.

9. The heat dissipating assembly as claimed in claim 7, wherein each of the pair of arced latches extends along a horizontal orientation, and the each of the plurality of curved latches extends along a vertical orientation.

10. The heat dissipating assembly as claimed in claim 7, wherein each of the pair of wire clips comprises an upward distal section, a pivoting section bent horizontally from the distal section, a pressing section formed upwardly from the pivoting section, another horizontal pivoting section connecting the pressing section, and an operating section extending upwardly from the another pivoting section, the pivoting section being engaged in a distal one of the plurality of curved latches, the another pivoting section being locked into two of the plurality of curved latches adjacent to the distal one of the plurality of curved latches, and the operating section being locked into a corresponding one of the pair of arced latches.

11. The heat dissipating assembly as claimed in claim 10, wherein the pressing section of the each of the pair of wire clips comprises a pair of parallel connecting portions connecting the pivoting section and the another pivoting section respectively, and a bent portion extending inwardly from two ends of the pair of connecting portions, the bent portion being located above the top members of the flange.

12. The heat dissipating assembly as claimed in claim 11, wherein when the operating section of the each of the pair of wire clips is pivoted to be locked into the corresponding one of the pair of arced latches, the pressing section is driven by the operating section to rotate, with the pair of connecting portions thereof pushing the fan to slide inwardly, and the bent portion thereof abutting downwardly against a bottom of the lateral side of fan to sandwich it with the pair of top members of the flange.

13. The heat dissipating assembly as claimed in claim 1, wherein the second holder comprises a plate secured at the opposite lateral side of the heat sink, and a pair of strips extending horizontally and inwardly from a top of the plate for supporting the another part of the fan.

14. The heat dissipating assembly as claimed in claim 13, wherein each of the pair of strips has an end divided into two pieces along a midline of a width thereof, one of which is bent upwardly and slantwise for abutting downwardly against a bottom of an opposite lateral side of the fan, and another of which maintains its original configuration and supports the opposit lateral side of the fan.

15. The heat dissipating assembly as claimed in claim 1, wherein the heat sink comprises a base and a plurality of fins extending upwardly from the base with some of the plurality of fins each having an upper portion bifurcating upwardly to form a fork configuration, the first holder and the second holder being attached to the some of the plurality of fins.

16. A heat dissipating assembly, comprising:
a heat sink;
a fan mounted on the heat sink;
a first locking device mounted on a first side of the heat sink and having a supporting plate extending beyond the heat sink, a part of the fan mounted on the supporting plate; and
a second locking device mounted on a second side of the heat sink, the first and second locking devices cooperatively pressing two opposite sides of the fan to mount the fan onto the heat sink.

17. The heat dissipating assembly as claimed in claim 16, wherein the first locking device comprises a pair of wire clips pivotably mounted on the supporting plate, each clip having a pressing portion pressing the fan when the clip is in a closed position.

18. The heat dissipating assembly as claimed in claim 17, wherein the second locking device has a vertical plate and a pair of elongated strips to press the fan.

19. The heat dissipating assembly as claimed in claim 17, wherein a distance exists between a side of the fan engaging with the second locking device and a vertical plate of the second locking device.

20. The heat dissipating assembly as claimed in claim 19, wherein the distance is equal to a length of the fan extending beyond the heat sink.

* * * * *